(12) United States Patent
Tatsumi (10) Patent No.: US 9,369,100 B2
(45) Date of Patent: Jun. 14, 2016

(54) TRAVELING WAVE AMPLIFIER PROVIDING CASCADE UNITS EACH INCLUDING A DYNAMIC CASCADE TRANSISTOR WHOSE COLLECTOR OUTPUT IS FED BACK TO ITS BASE INPUT

(71) Applicant: SUMITOMO ELECTRIC INDUSTRIES, LTD., Osaka-shi, Osaka (JP)

(72) Inventor: Taizo Tatsumi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/272,865

(22) Filed: May 8, 2014

(65) Prior Publication Data

US 2014/0333374 A1 Nov. 13, 2014

(30) Foreign Application Priority Data

May 10, 2013 (JP) ................................. P2013-100654

(51) Int. Cl.
*H03F 3/68* (2006.01)
*H03F 3/60* (2006.01)
*H03F 3/45* (2006.01)

(52) U.S. Cl.
CPC ............ *H03F 3/605* (2013.01); *H03F 3/45089* (2013.01); *H03F 3/68* (2013.01)

(58) Field of Classification Search
CPC ....... H03F 3/211; H03F 3/602; H03F 1/0288; H03F 1/20; H03F 3/607; H03F 1/223; H03F 1/22; H04B 3/06
USPC ................. 330/53, 54, 124 R, 286, 295, 311
See application file for complete search history.

(56) References Cited

U.S. PATENT DOCUMENTS

| | | | | |
|---|---|---|---|---|
| 4,394,590 A * | 7/1983 | Honda | .......................... | 327/436 |
| 6,958,840 B2 | 10/2005 | Tsai | | |
| 7,071,786 B2 * | 7/2006 | Inoue et al. | ................... | 330/311 |
| 7,279,980 B2 * | 10/2007 | Heydari et al. | ............... | 330/286 |
| 8,228,125 B2 * | 7/2012 | Heijden et al. | ................ | 330/311 |
| 8,786,368 B2 * | 7/2014 | Benson | .......................... | 330/286 |
| 2007/0075784 A1 * | 4/2007 | Pettersson et al. | ............ | 330/311 |

FOREIGN PATENT DOCUMENTS

JP 09-130170 5/1997
JP 2010-272918 12/2010

* cited by examiner

*Primary Examiner* — Khanh V Nguyen
(74) *Attorney, Agent, or Firm* — Smith, Gambrell & Russell, LLP (57) ABSTRACT

A traveling wave amplifier including differential circuits to suppress the backward wave effect is disclosed. The differential amplifier includes two cascade units providing a switching transistor, a static cascade transistor, and a dynamic cascade transistor connected in series. The dynamic cascade transistor provides a feedback circuit to feed the collector output to the base input thereof through a resistive divider in lower frequencies and a capacitive divider in high frequencies.

20 Claims, 11 Drawing Sheets

TRAVELING WAVE AMPLIFIER PROVIDING CASCADE UNITS EACH INCLUDING A DYNAMIC CASCADE TRANSISTOR WHOSE COLLECTOR OUTPUT IS FED BACK TO ITS BASE INPUT

BACKGROUND

1. Field of the Invention

The present application relates to a travelling wave amplifier, in particular, the present application relates to a differential circuit implemented within the travelling wave amplifier.

2. Background Art

Recent optical communication system provides an optical transmitter that performs the electric/optical signal conversion and the transmission of the converted optical signal by using a light source and an optical modulator such as Electro Absorption Modulator (EAM), Mach-Zehnder Modulator (MZM), and so on. In order to drive such optical modulators in high frequencies; a driver circuit with an arrangement of a traveling wave amplifier is often applied. Depending on types of the optical modulator, the driver is sometimes requested to output a modulation signal with amplitude of 2 to 8 V. The amplitude sometimes exceeds a breakdown voltage of transistors in the driver.

SUMMARY

One aspect of the present application relates to a traveling wave amplifier that comprises a plurality of amplifying units connected in parallel between an input port and an output port of the traveling wave amplifier. The amplifying units each include a differential amplifier providing a pair of cascade units. The cascade unit includes a switching transistor, a dynamic cascade transistor, and a static cascade transistor, where the transistors are connected in series to each other. The switching transistor receives an input modulating signal from the input port. The dynamic cascade transistor outputs an amplified output signal to the output port, and feeds the amplified output thereof back to a base of the dynamic cascade transistor through a resistive divider. A feature of the travelling wave amplifier is that the static cascade transistor, which is driven by a static bias applied to the base thereof, is interposed between the switching transistor and the dynamic cascade transistor.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Next, some embodiments according to the present application will be described as referring to drawings. In the description of the drawings, numerals or symbols same or similar to each other will refer to elements same or similar to each other without overlapping explanations.

Figure 1:
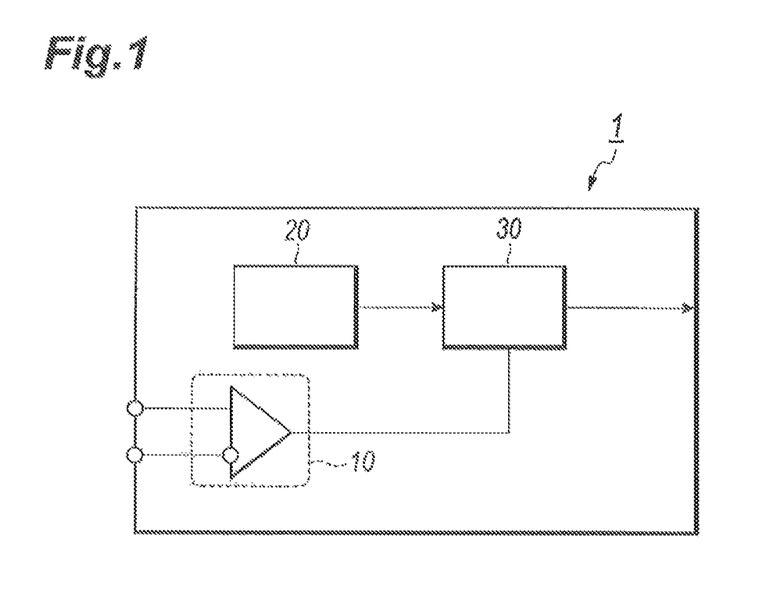
FIG. 1 is a schematic block diagram of a transmitter optical module of the present application.
Figure 2:
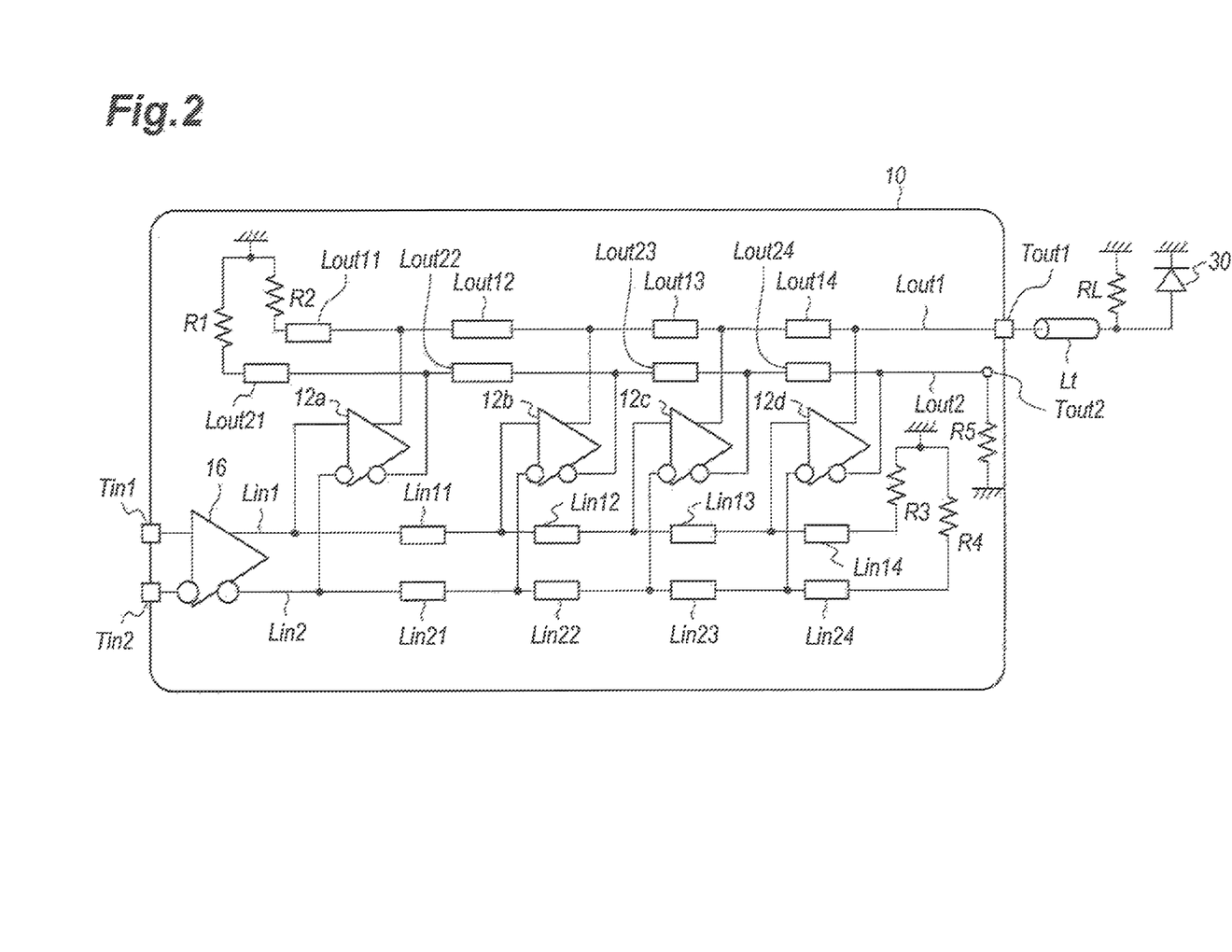
FIG. 2 is a circuit diagram of a travelling wave amplifier implemented within the transmitter optical module shown in FIG. 1.

FIG. 1 is a schematic block diagram of transmitter optical module, and FIG. 2 is a circuit diagram of a traveling wave amplifier implemented within the transmitter optical module shown in FIG. 1. The transmitter optical module 1, which is applicable to the optical communication system, includes a light source 20 such as a laser diode, an optical modulator 30 such as EA-modulator, MZ-modulator, and so on, and a traveling wave amplifier 10 to drive the optical modulator 30. The optical modulator 30 is connected in parallel to a terminator RL (shown in FIG. 2). One end of the parallel circuit of the optical modulator 30 and the terminator RL are connected with an output port of the travelling wave amplifier 10 through a transmission line Lt. The other end of the parallel circuit is grounded.

As shown in FIG. 2, the travelling wave amplifier 10 includes a plurality of amplifying units, 12a to 12d, connected in parallel between input transmission lines, Lin1 and Lin2, and output transmission lines, Lout1 and Lout2. The traveling wave amplifier 10 of the embodiment provides four (4) amplifying units, 12a to 12d, each having an arrangement of a differential amplifier; however, the travelling wave amplifier 10 may provide at least two (2) or more amplifying units. A delay attributed to respective input transmission lines, Lin1 and Lin2, and that of the output transmission lines, Lout1 and Lout2, depends on the number of the amplifying unit.

The input transmission lines, Lin1 and Lin2, are connected to the input ports, Tin1 and Tin2, through an front amplifier 16. The input ports, Tin1 and Tin2, each receive a pair of input signals complementary to each other. Specifically, one of the input ports Tin1 receives a signal having a phase, while, the other input port Tin2 receives a signal having another phase opposite to the former phase. The input transmission lines, Lin1 and Lin2, are terminated by resistors, R3 and R4, in the other ends thereof.

One of the output transmission lines Lout1 is connected to the output port Tout1, while, terminated by a resistor R2 in the other end thereof. The other output transmission line Lout2 is terminated by resistors, R5 and R1, in both ends thereof.

The travelling wave amplifier 10 provides the front amplifier 16 in front of the input transmission lines, Lin1 and Lin2. Specifically, the front amplifier 16 has the arrangement of the differential amplifier having two input terminals each connected to the input ports, Tin1 and Tin2, and two output terminals from which the input transmission lines, Lin1 and Lin2, are pulled out. The front amplifier 16 is set in the travelling wave amplifier 10 not to keep steady described, the amplifying units, 12a to 12d, have the differential arrangement having two input terminals connected to the input transmission lines, Lin1 and Lin2, and two output terminals connected to the output transmission lines, Lout1 and Lout2. The amplifying units, 12a to 12d, are set in the travelling wave amplifier 10 not to maintain the phase of the signals input thereto.

Specifically, the amplifying units, 12a to 12d, receive a signal output from the non-inverting output terminal of the front amplifier 16 in respective non-inverting input terminals thereof; while another signal output from the inverting output terminal of the front amplifier 16 is received in respective inverting input terminals. Also, the amplifying units, 12a to 12d, output signals with a normal phase from respective non-inverting output terminals to the output transmission line Lout1; and other signals with a reverse phase from respective inverting output terminals to the other output transmission line Lout2.

The amplifying units, 12a to 12d, each receives input signals provided to the input ports, Tin1 and Tin2, by specific delays inherently attributed to respective input delay elements, Lin1 and Lin2, through the front amplifier 16. The specific delays depend on paths from the input ports, Tin1 and Tin2, to the input terminals of respective amplifying units, 12a to 12d; that is, the specific delays depend on lengths of the input transmission lines, Lin1 and Lin2, from the output terminals of the front amplifier 16 to the input terminals of the amplifying units, 12a to 12d. A transmission line having a substantial length generally induces a delay td determined by an equation of:

$$td=(LC)^{1/2},$$

where L is inductance and C is capacitance of the transmission line under consideration.

The input transmission lines, Lin11 and Lin21, are put between respective pairs of the input terminals of the amplifying units, 12a and 12b; and cause delays determined by the input capacitance of the amplifying unit 12b, line capacitance, and line inductance of the input transmission lines, Lin11 and Lin21. The second input transmission lines, Lin12 and Lin22, are put between respective pairs of the input terminals of the amplifying units, 12b and 12c; and cause delays also determined by the input capacitance of the amplifying unit 12c, line capacitance, and line inductance of the input transmission lines, Lin12 and Lin22. The third input transmission lines, Lin13 and Lin23, are put between respective pairs of the input terminals of the amplifying units, 12c and 12d; and cause delays determined by the input capacitance of the amplifying unit 12d, line capacitance and line inductance of the input transmission lines, Lin13 and Lin23. The fourth input transmission lines, Lin14 and Lin24, are put between the pair of the input terminals of the amplifying unit 12d and the pair of the terminator, R3 and R4. In the description of the delay attributed to the input transmission lines, Lin11 to Lin24, the input capacitance of the amplifying units, 12b to 12d, of about 10 fF is estimated.

The second output transmission lines, Lout12 and Lout22, are put between respective pairs of the output terminals of the amplifying units, 12a and 12b; and cause delays determined by the output capacitance of the amplifying unit 12a, the line capacitance and the line inductance of the output transmission lines, Lout12 and Lout22. The third output transmission lines, Lin13 and Lin23, are put between respective pairs of the output terminals of the amplifying units, 12b and 12d; and cause delays determined by the output capacitance of the amplifying unit 12b, the capacitance and the inductance of the output transmission lines, Lout13 and Lout23. The fourth output transmission lines, Lout14 and Lout24, are put between respective pairs of the output terminals of the amplifying units, 12c and 12d; and cause delays determined by the output capacitance of the amplifying unit 12c, and the line capacitance and the inductance of the transmission lines, Lout14 and Lout24. In addition, the first output transmission lines, Lout11 and Lout21, are put between the pair of the output terminals of the amplifying unit 12a and the pair of the terminators, R1 and R2. In the description of the delays above presented, the output capacitance of the amplifying units, 12a to 12c, of about 20 fF is estimated.

In a travelling wave amplifier, the input transmission lines, Lin11 to Lin24, and the output transmission lines, Lout12 to Lout24, are generally set to have a common delay; and the amplifying units, 12a to 12d, also have a common delay but unnecessary to be equal to the delay of the input transmission lines, Lin11 to Lout24. Accordingly, a signal output from the front amplifier 16 appears at the output port Tout1 independent of the paths attributed to respective amplifying units, 12a to 12d. That is, a delay from the front amplifier 16 to the output port Tout1 through the first amplifying unit 12a, that through the second amplifying unit 12b, that through the third amplifying unit 12c, and that through the fourth amplifying unit 12d, are equal to each other, which means that signals output from the front amplifier 16 and appearing in the output port Tout1 but amplified by respective amplifying units, 12a to 12d, match the phases thereof. The signal provided in the input ports, Tin1 and Tin2, is amplified and appears in the output port Tout1 without deforming the waveform thereof.

In a travelling wave amplifier, the output transmission lines, Lout1 and Lout2, carry not only forward waves toward the output port Tout1 but also backward waves toward the terminators, R1 and R2. The backward waves are, for instance, those from the second amplifying unit 12b to the terminators, R1 and R2; those from the third amplifying unit 12c to the terminators, R1 and R2; and those from the fourth amplifying unit 12d to the terminators, R1 and R2. At the output terminals of the first amplifying unit 12a, those backward waves are superposed on the forward wave output from the first amplifying unit 12a. The backward waves from respective amplifying units, 12b to 12d, are not matched in the phases thereof because the paths for respective backward waves includes input and output delay elements whose total numbers are different from others. Accordingly, the signals at the output terminals of the first amplifying unit 12a are considerably degraded in the waveform thereof. Similarly, the waveform at the output terminals of the second amplifying unit 12b, and that at the output terminals of the third amplifying unit 12c are invariably degraded.

Figure 3:
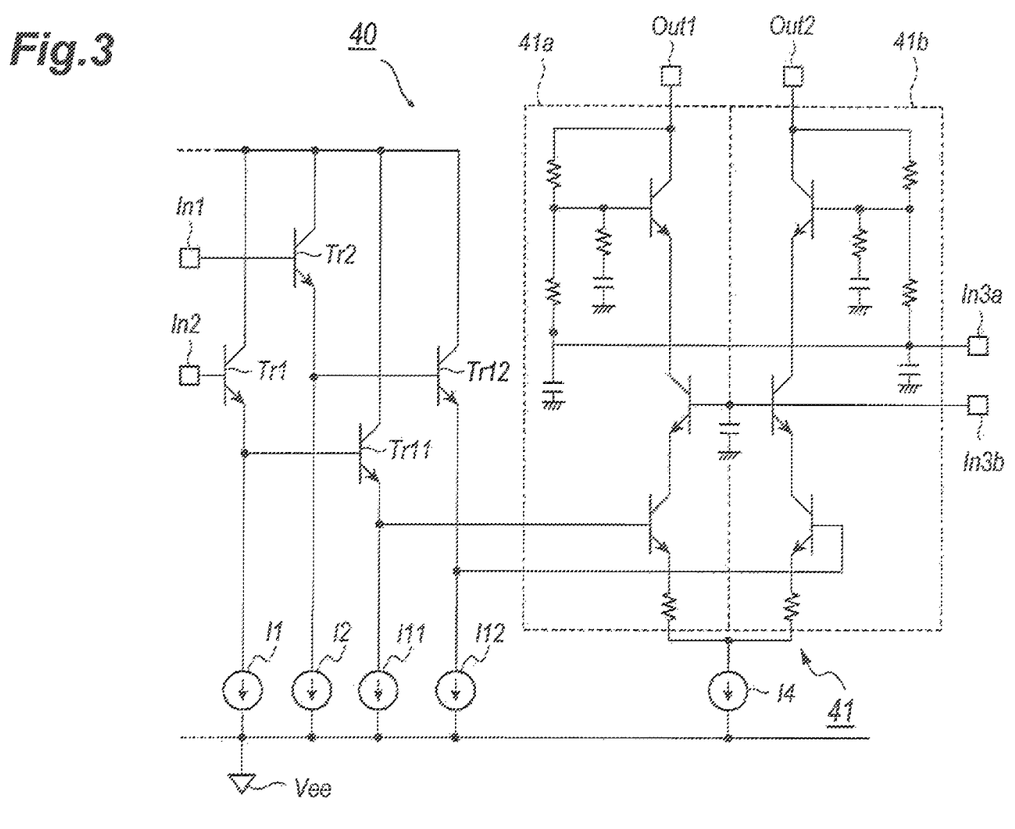
FIG. 3 is a circuit diagram of a differential circuit 40 implemented within the amplifying unit shown in FIG. 2.

Next, referring to FIGS. 3 and 4, the amplifying unit, 12a to 12d, will be described in detail. The amplifying units, 12a to 12d, as already described, have the arrangement of a differential circuit 40 as shown in FIG. 3. The differential circuit 40 includes transistors, Tr1, Tr2, Tr11, and Tr12, a differential circuit 41 having two cascade units, 41a and 41b, and current sources, I1, I2, I11, I12, and I4. The differential circuit 40 amplifies signals complementary to each other provided to the input ports, In1 and In2, to output the amplified complementary signals from the output ports, Out1 and Out2.

The transistors, Tr1 to Tr12, and current sources, I1 to I12, constitute two emitter follower circuits, that is, two transistors, Tr1 and Tr11, and two current sources, I1 and I11, constitute one of emitter followers coupled with one of input ports In2, while, the other two transistors, Tr2 and Tr12, and the other two current sources, I2 and I12, constitute the other emitter follower coupled with another input port In1. The former emitter follower drives the left cascade unit 41a, while, the latter emitter follower drives the right cascade unit 41b.

Figure 4:
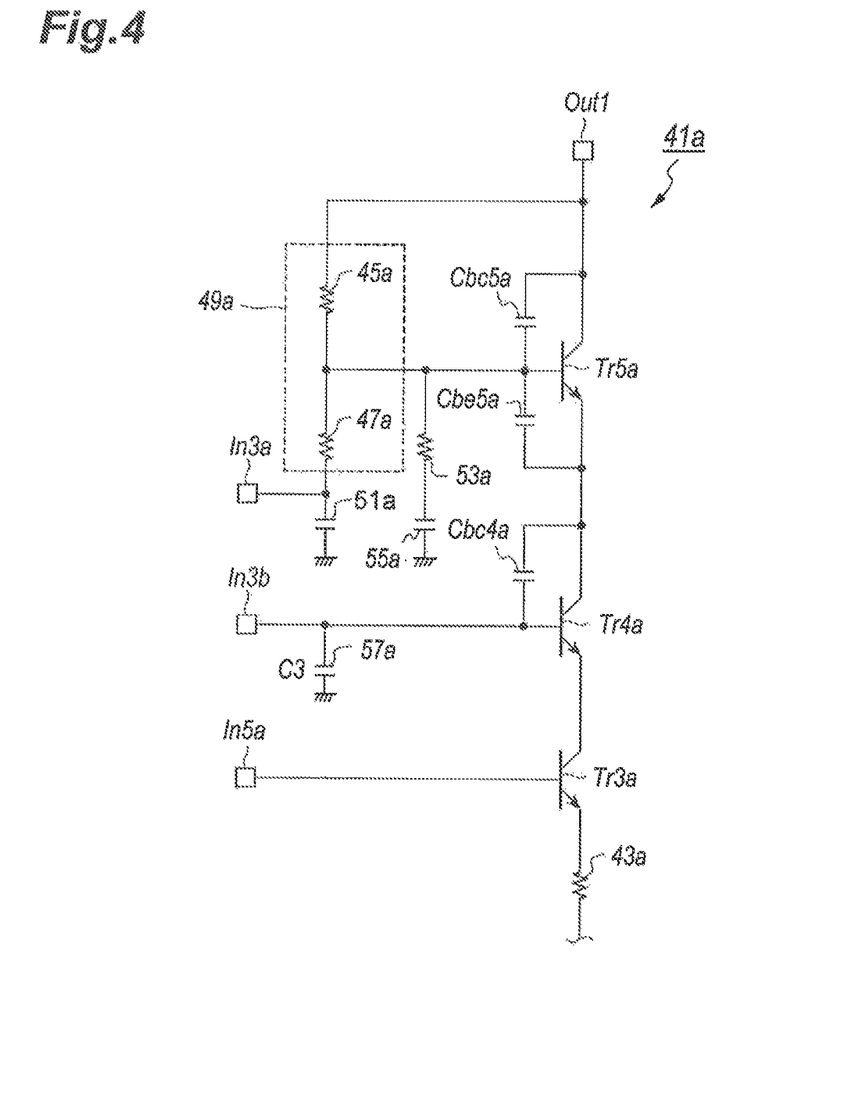
FIG. 4 extracts the cascade unit constituting the differential amplifier of FIG. 3.

Referring to FIG. 4, the cascade unit 41a includes a switching transistor Tr3a, a static cascade transistor Tr4a, and a dynamic cascade transistor Tr5a connected in series between the output port Out1 and the power supply Vee, where FIG. 4 omits the current source I4 connected between the resistor 43a and the power supply Vee. Three transistors, Tr3a to Tr5a, are the type of the npn transistor, where the intermediate transistor Tr4a is connected in the collector thereof to the emitter of the dynamic cascade transistor Tr5a, while, the emitter of the static cascade transistor Tr4a is connected to the collector of the switching transistor Tr3a. The collector of the dynamic cascade transistor Tr5a becomes the output port Out1 with the arrangement of, what is called, the open-collector circuit.

The cascade unit 41a further provides a resistance type divider, which is often called as a voltage divider, including two resistors, 45a and 47a, between the output port Out1 and a bias port In3a. The resistive divider biases the base of the dynamic cascade transistor Tr5a. Accordingly, the collector output of the dynamic cascade transistor Tr5a is fed back to the base of the dynamic cascade transistor Tr5a through the resistive divider. High frequency components, for instance, those derived from amplified signals or noises, appearing at the bias port In3a are bypassed to the ground by a capacitor 51a.

The static cascade transistor Tr4a is also biased in the base thereof by the bias Vt supplied to the port In3b. High frequency components, for instance, those derived from noises, appearing at the input port In3b are bypassed by a capacitor 57a whose capacitance is enough large to short-circuit the input port In3b to the ground. The switching transistor Tr3a is driven by the input signal through the emitter follower as described previously.

The operation of the cascade unit 41a will be further described.

The dynamic cascade transistor Tr5a inherently provides junction capacitance and parasitic capacitance between the base and the collector, and between the base and emitter, where those capacitors are denoted as Cbc5a and Cbe5a, respectively. The static cascade transistor Tr4a also inherently has the junction capacitance and the parasitic capacitance. FIG. 4 illustrates such capacitors only between the base and the collector thereof by the symbol Cbc4a. The base of the dynamic cascade transistor Tr5a, as described above, is determined by the bias Vt provided in the input port In3a superposed with the feedback from the output Out1 divided by the resistive divider 49a. Because the bypass capacitor 51a has capacitance large enough to short-circuit the input port In3a to the ground even in low frequencies, the base bias Vcasb of the dynamic cascade transistor Tr5a in low frequencies is given by:

$$Vcasb = Vt + (Vout - Vt) \times Rb/(Ra + Rb),$$

where Ra and Rb are the resistance of the resistors, 47a and 45a, respectively.

On the other hand, because the base-emitter junction of the dynamic cascade transistor Tr5a is forwardly biased, the junction capacitance thereof is enough greater than that of the base-collector junction, which are reversely biased, of the dynamic and static cascade transistors, Tr5a and Tr4a. Accordingly, an equivalent circuit around the dynamic cascade transistor Tr5a may be regarded as that shown in FIG. 5, where symbols of Vcasb, Ra to Rc, Ca, Cc5 to Cc4 are the base level of the dynamic cascade transistor Tr5a, the resistance of resistors, 45a, 47a and 53a, and the capacitance of the capacitors, 55a, Cbc5a, and Cbc4a, respectively. Because the capacitance of the base-emitter junction capacitor Cbe5a of the dynamic transistor Tr5a, as described above, is enough greater than that of the base-collector junction capacitor Cbc5a, the base of the dynamic cascade transistor Tr5a may be regarded to be short-circuited to the emitter thereof in high frequencies. The capacitance Cc5 of the base-collector junction capacitor is an equivalent capacitance taking the transconductance Gm of the transistor Tr4a into account. Also, assuming the capacitance of the capacitor 57a is enough greater than the base-collector junction capacitance of the dynamic cascade transistor Tr5a, the base of the static cascade transistor Tr4a is regarded to be grounded in high frequencies.

Figure 5:
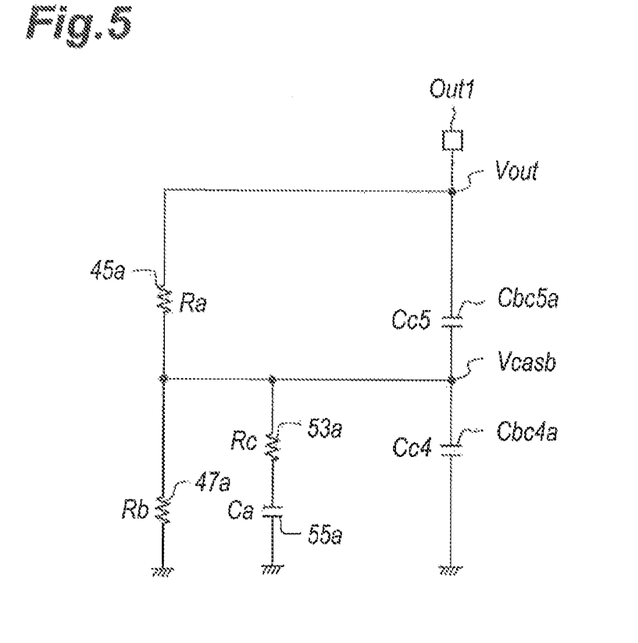
FIG. 5 is an equivalent circuit diagram around the dynamic cascade transistor in the cascade unit of FIG. 4.

As shown in FIGS. 4 and 5, the base bias of the dynamic cascade transistor Tr5a is determined by the resistive divider of two resistors, 45a and 47a, whose resistance are R1 and R2, in low frequencies, namely, in a frequency regions where the impedance of the base-collector junction capacitors, Cbc5a and Cbc4a, are enough large compared with the resistance of the resistors, 45a and 47a. On the other hand, the base bias is determined by the capacitive divider of two capacitors, Cbc5a and Cbc4a, in high frequencies where the impedance of the capacitors, Cbc5a and Cbc4a, are small enough compared with the resistance of two resistors, 45a and 47a. Specifically, the base level Vcasb is given by:

$$Vcasb/Vout = Cc5/(Ca + Cc4 + Cc5),$$

in a region where $R3 \ll 1/(Ca \times \omega)$.

Accordingly, even when the output Vout in the phase thereof is asynchronous with that of the input signal Vin provided in the input port In5a of the cascade unit 41a, the base bias level Vcasb may be set in a predetermined ratio against the output Vout by setting a ratio of the capacitance of the capacitors, Ca+Cc4 and Cc5. For instance, the capacitance of two capacitors, Cc4 and Cc5, are set to be equal; the base level Vcasb of the dynamic cascade transistor Tr5a may be kept in a half of the output Vout, namely, Vcasb=Vout/2.

Thus, the base level Vcasb of the dynamic cascade transistor Tr5a is simply determined by the output Vout independent of the input signal Vin in both low frequencies and high frequencies. The collector-emitter bias Vce of the dynamic cascade transistor Tr5a may be prevented from being unnecessarily increased.

The operation of the right cascade unit 41b is substantially same with those of the left cascade unit 41a described above. That is, even when the output Out2 in the phase thereof is asynchronous with that of the input signal In1, the base level Vcasb of the dynamic cascade transistor is determined by two resistors in low frequencies and the capacitor 57a and two capacitors, Cbc5a and Cbc4a, of the cascade transistors in high frequencies. The capacitor 57a is common to the left and right cascade units, 41a and 41b, in the present embodiment.

The travelling wave amplifier 10 thus described provides in the differential circuit 40 that provides a series unit of a dynamic cascade transistor Tr5a and a static cascade transistor Tr4a. Moreover, the base level Vcasb of the dynamic cascade transistor Tr5a is determined by the output Vout thereof in low and high frequencies, which effectively stabilizes the collector-emitter bias Vce of the dynamic cascade transistor Tr5a. Even when the output Vout abruptly causes overshoots and/or undershoots, the collector-emitter bias Vce is prevented from exceeding a breakdown voltage of the dynamic cascade transistor Tr5a. Furthermore, the circuit of the present embodiment enables to enhance the power supply voltage exceeding the breakdown voltages of the switching transistor, the static cascade transistor, and the dynamic cascade transistor, which means that the output amplitude of the amplifier 40 may be increased over the breakdown voltages of the transistors.

Figure 8:
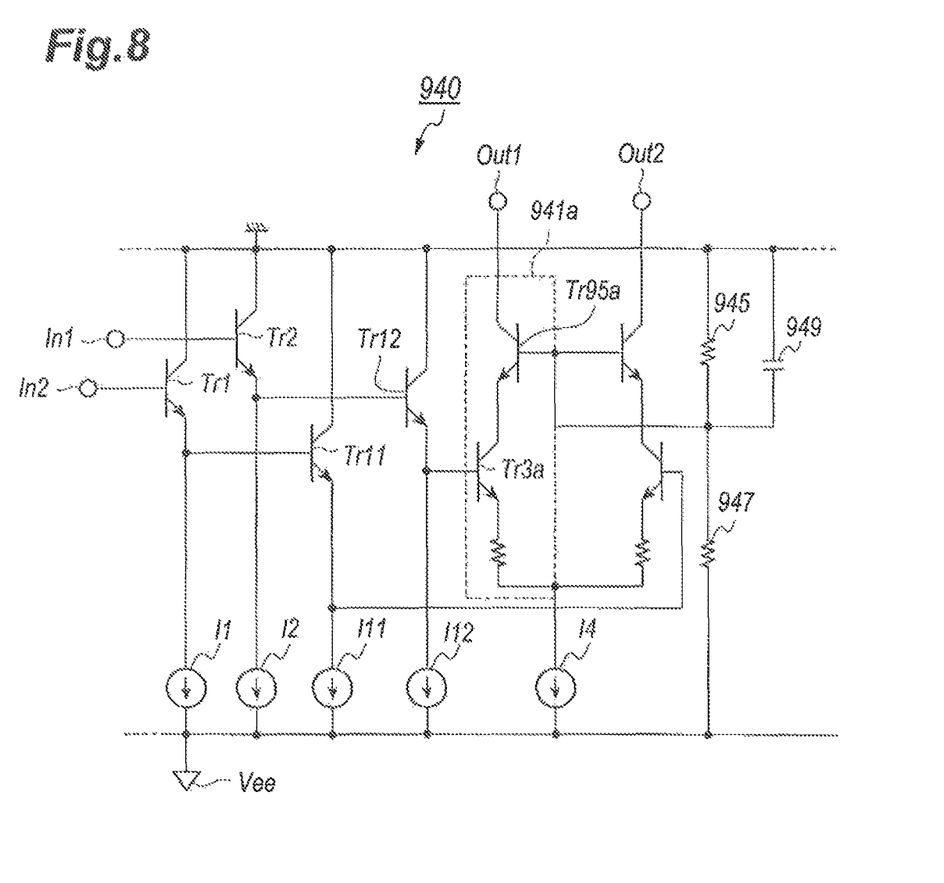
FIG. 8 is a diagram of a differential circuit comparable to the differential circuit shown in FIG. 3.

The traveling wave amplifier 10 of the present embodiment will be compared with a conventional travelling wave amplifier. FIG. 8 shows a circuit diagram of an amplifying unit 940 comparable with that shown in FIG. 3. The amplifying unit 940 includes a differential circuit that provides a cascade unit 941a distinguishable from the cascade unit 41a of the present embodiment. Specifically, the cascade unit 941a shown in FIG. 8 omits the dynamic cascade transistor, and includes only the static cascade transistor Tr95a whose base is not only biased by the resistive divided of two resistors, 945 and 947, but grounded through a capacitor 949. No feedback components from the output Out1 are provided around the cascade transistor Tr95a.

The cascade transistor Tr95a of the comparable circuit stabilizes the collector level of the switching transistor Tr3a. That is, providing the cascade transistor Tr95a whose base bias is stabilized by the resistive divider and the capacitor connected in series to the collector of the switching transistor Tr3a, the switching transistor Tr3a may switch the current flowing therein as stabilizing the collector level thereof, which effectively reduces the miller effect between the collector and the base of the switching transistor Tr3a. However, the cascade transistor Tr95a stabilizes the collector-emitter bias Vce of the switching transistor Tr3a, but the collector-emitter bias Vce of the cascade transistor Tr95a is left unstable or widely modulated between the power supply voltage Vee and the ground. Thus, the cascade transistor Tr95a is inevitably requested to have a large breakdown voltage.

Figure 9:
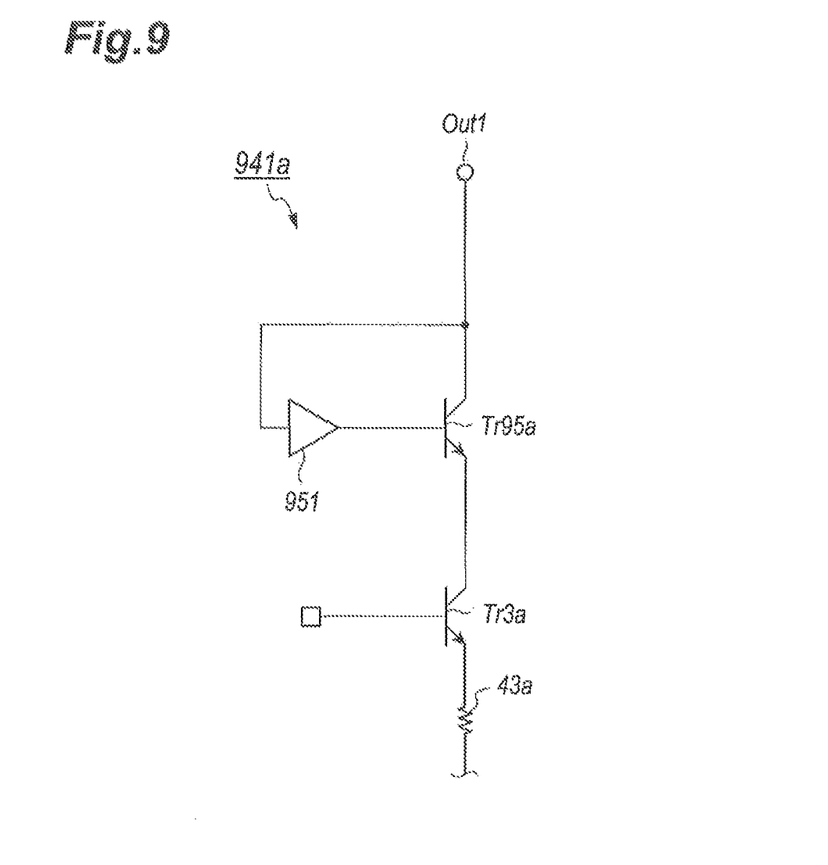
FIG. 9 explains a mechanism of the cascade unit whose base bias is fed back from the collector output thereof.
Figure 10:
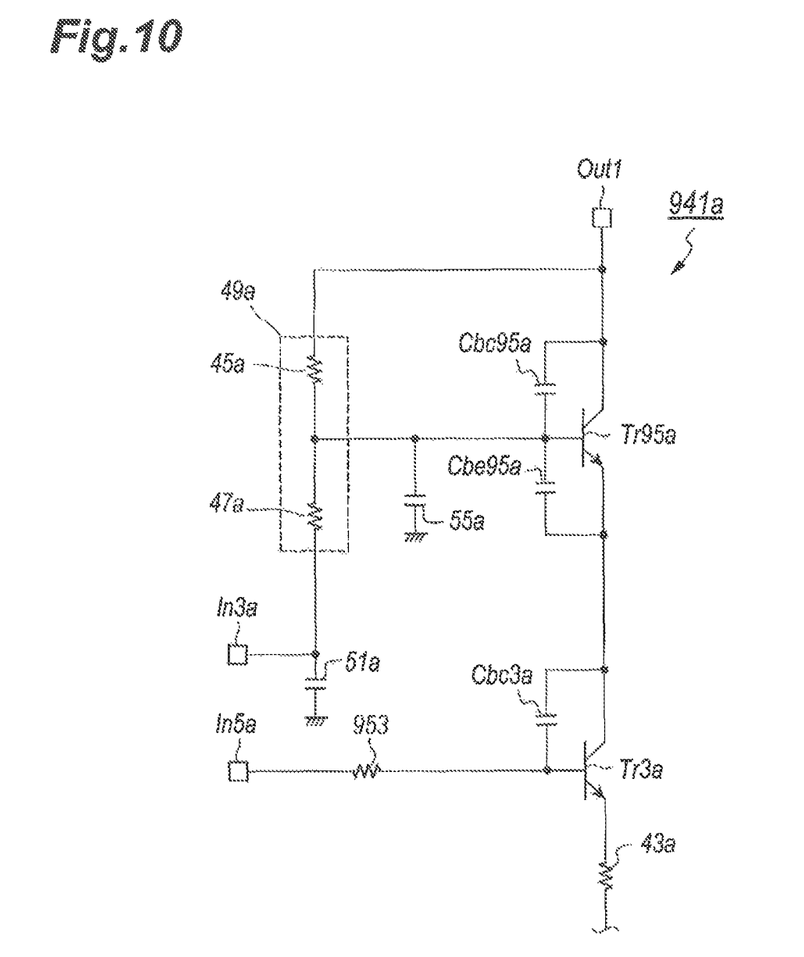
FIG. 10 extracts the cascade unit in the comparable differential circuit.

One technique to avoid the subject is to provide a buffer circuit to feed the collector output Out1 of the cascade transistor Tr95a back to the base thereof, which is shown in FIG. 9. FIG. 10 is an example of the buffer circuit to feed the output Out1 back to the base of the cascade Transistor Tr95a.

The cascade unit 941a includes the switching transistor Tr3a and the cascade transistor Tr95a connected in series to the switching transistor Tr3a. The cascade transistor Tr95a provides the feedback unit same as those of the cascade unit 41a of the embodiment shown in FIG. 4. Specifically, the feedback circuit includes the resistive divider 49a connecting the output Out1 to the input port In3a that receives a bias Vt. The base of the cascade transistor Tr95a couples with the output Out1 through the resistive divider 49a and is grounded through the capacitor 51a. The switching transistor Tr3a in the base thereof receives the input signal provided in the input port In1 through the two-stage emitter follower. The cascade transistor Tr95a, same as that Tr5a of the present embodiment, inherently accompanies the base-collector junction capacitor Cbc95a and the base-emitter junction capacitor Cbe95a; the switching transistor Tr93a also accompanies the base-collector junction capacitor Cbc4a.

In the comparable cascade unit 941a, the output Out1 is fed back to the base of the cascade transistor Tr95a through the resistive divider 49a in low frequencies. On the other hand, because the base-emitter junction is forwardly biased, the base-emitter junction capacitor Cbe95a inherently has the capacitance enough larger than that of the base-collector junction capacitor Cbc95a, which means that the base-emitter of the cascade transistor Tr95a is short-circuited in high frequencies.

Figure 11:
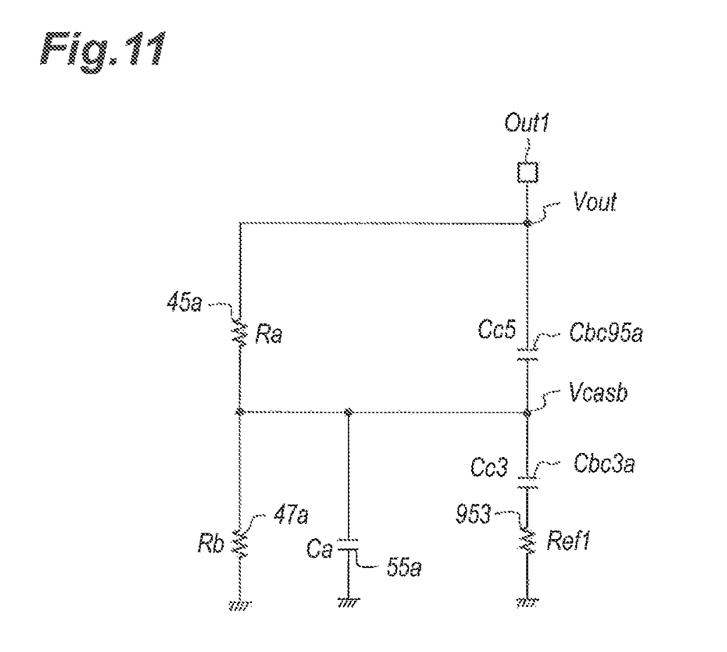
FIG. 11 is an equivalent circuit diagram around the cascade transistor in the comparable differential circuit.

Assuming the capacitance of the base-collector junction capacitors, Cbc95a and Cbc3a, of the cascade transistor Tr95a and the switching transistor Tr3a to be Cc5 and Cc3, respectively; the equivalent circuit around the cascade transistor TR95a in high frequencies becomes that shown in FIG. 11, where the base input of the switching transistor Tr3a is grounded, and the resistor 953 has the resistance Ref1. Referring to FIG. 11, the base level Vcasb of the cascade transistor Tr95a in high frequencies may be determined by the capacitive divider of two base-collector junction capacitors, Cbc95a and Cbc3a. Two junction capacitors, Cbc95a and Cbc3a, in the capacitance thereof are not always same, rather the junction capacitance depends on a size of the transistor. Generally, the switching transistor Tr3a has smaller dimensions to facilitate the driving by the upstream circuit; while, the cascade transistor Tr95a has lager dimensions to have the driving of the load element in facilitated. In such an arrangement, the junction capacitor of the switching Transistor Tr3a inevitably becomes smaller compared with that of the cascade transistor Tr95a, and the capacitor 55a provided in the base of the cascade transistor Tr95a may compensate the ratio of the capacitive divider so as to set the dividing ratio close to be even.

In a traveling wave amplifier, the output Vout of respective amplifying units become asynchronous with the input signals Vin due to backward waves, which means that the base-collector bias of the switching transistor Tr3a and that of the cascade transistor Tr95a randomly vary. In the equivalent circuit of the comparable cascade unit 941 shown in FIG. 11, the base level Vcasb of the cascade transistor Tr95a is unable to be set in a predetermined value determined by the capacitors, Cbc95a, Cbc3a, and C1, even when the capacitance thereof is set so as to give a preset dividing ratio.

On the other hand, the embodiment shown in FIG. 3 provides the static cascade transistor Tr4a between the dynamic cascade transistor Tr5a and the switching transistor Tr3a, which stabilizes the emitter level of the dynamic cascade transistor Tr5a (or the collector level of the static cascade transistor Tr4a) even in high frequencies.

The comparable cascade unit 941a shown in FIGS. 10 and 11 provides a resistive element 953 between the input port In5a and the base of the switching transistor Tr3a, which operates as a dumping resistor to reduce the Q-factor of a resonance loop constituted by the resistor 47a, the capacitor 55a, and the junction capacitor Cbc3a. The cascade unit of the present embodiment shown in FIGS. 4 and 5 directly grounds the base-collector junction capacitor Cbc4a of the static cascade transistor Tr4a, which automatically increases the Q-factor of the resonance loop attributed to the base of the dynamic cascade transistor Tr5a. The resistor 53a connected in series to the capacitor 55a may operate as a dumping resistor to reduce the Q-factor. The static cascade transistor Tr4a in the base or the emitter thereof provides a dumping resistor. However, a dumping resistor provided in the base reduces the current gain of the static cascade transistor Tr4a, while, that provided in the emitter increases the power dissipation of the cascade unit 41a because the current set by the current source I4 flows therein. The series circuit of the resistor 53a and the capacitor 55a connected in parallel to the base of the dynamic cascade transistor Tr5a may effectively reduce the Q-factor of the loop without increasing the power dissipation and decreasing the current gain.

Figure 6:
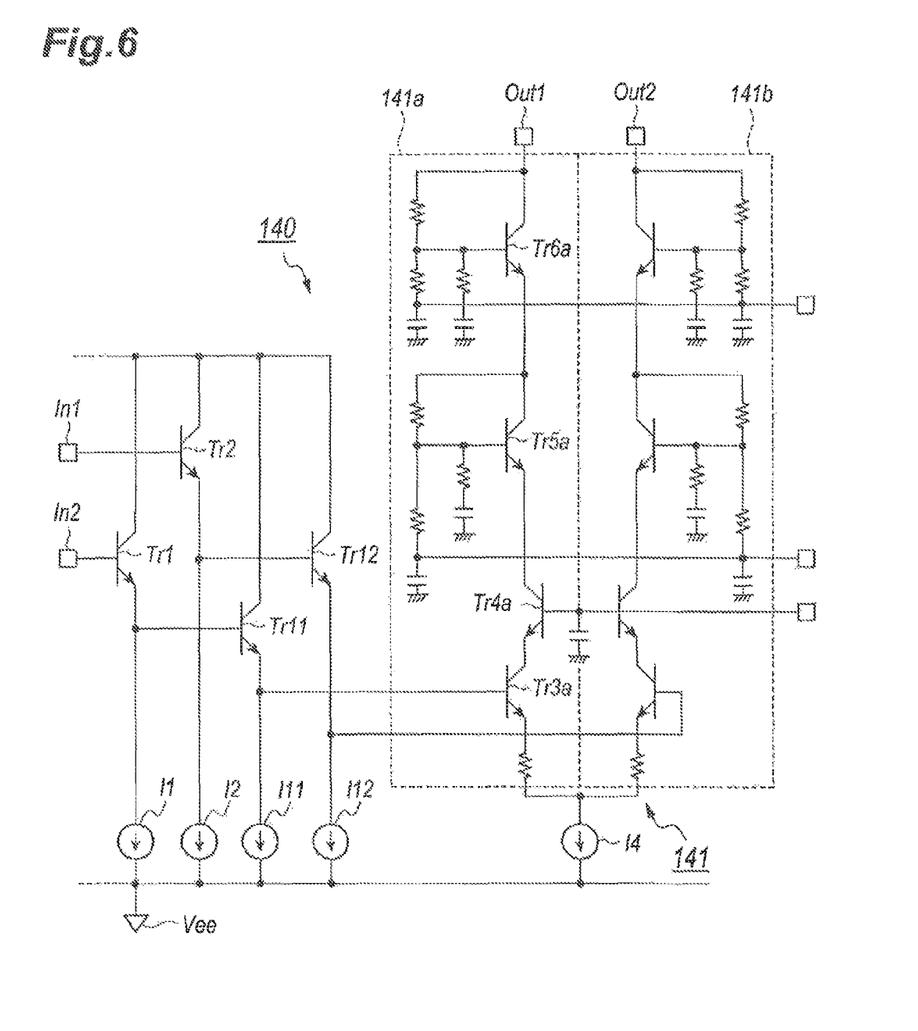
FIG. 6 is a diagram of a differential circuit according to another embodiment of the present application.

The inventions thus described as referring to drawings are not restricted to embodiments. For instance, the amplifying unit may provide cascade units, 141a and 141b, in a differential circuit 140. The cascade units, 141a and 141b, shown in FIG. 6 provides two dynamic cascade transistors, Tr6a and Tr5a, where they are connected in series between the output Out1 and the static cascade transistor Tr4a. Two dynamic cascade transistors have the same arrangement between the collector and the base thereof. As described above, even when the power supply voltage exceeds the breakdown voltage of respective transistors, the power supply voltage may be stable and effectively divided into respective transistors. Accordingly, the collector-emitter bias for respective transistors are suppressed to less than the breakdown boltage.

Figure 7:
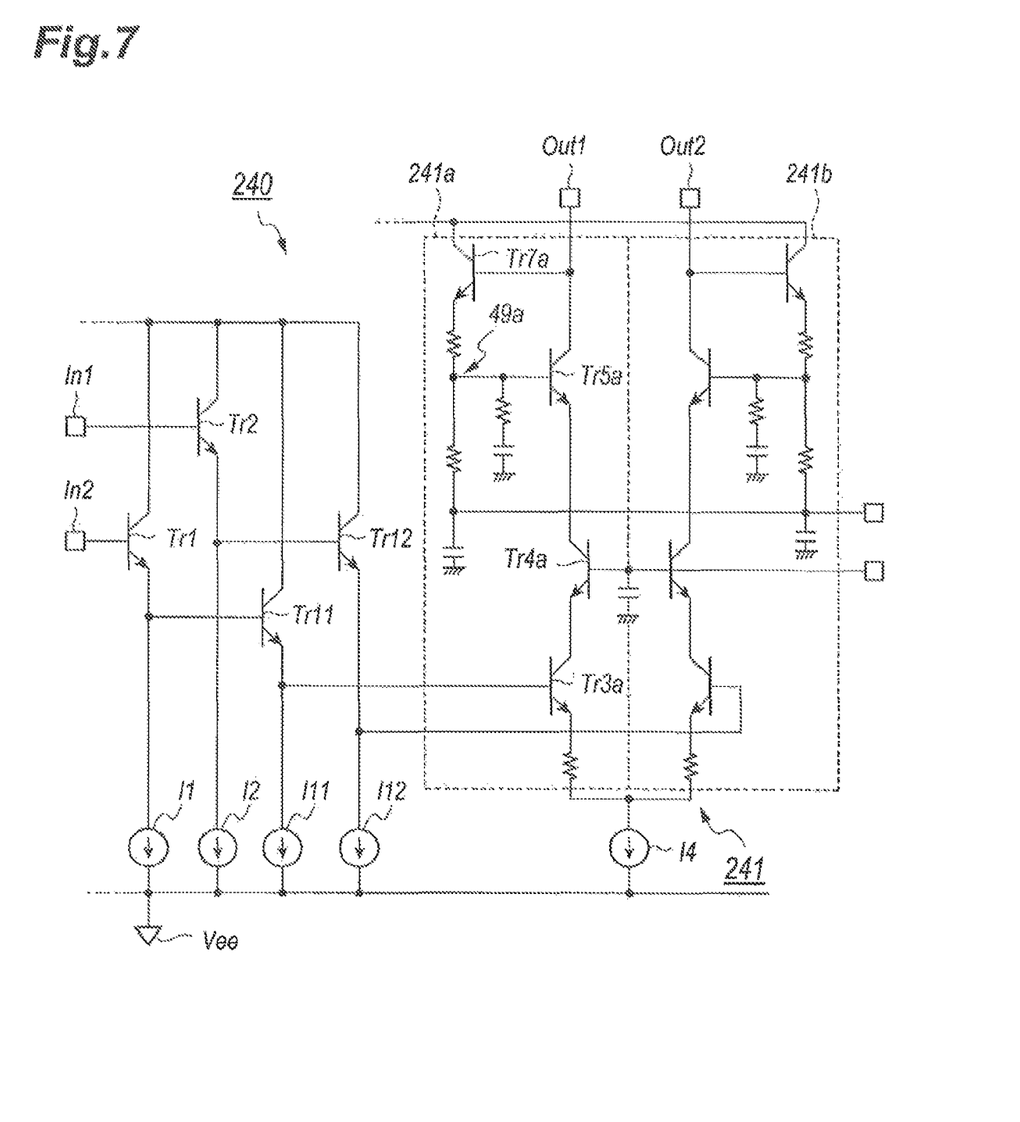
FIG. 7 is a diagram of a differential circuit according to still another embodiment of the present application.

Also, the differential circuit in respective amplifying units may provide the cascade units as shown in FIG. 7. The cascade units, 241a and 241b, have a feature to provide an emitter follower Tr7a. Specifically, the output Out1 is fed back to the base of the dynamic cascade transistor Tr5a through the emitter follower Tr7a and the resistive divider 49a. When the output Out1 directly connects the resistor 45a, the output impedance of the differential amplifier 40 is necessary to take the resistance of the resistor 45a, or the resistive divider 49a, into account. The emitter follower Tr7a effectively hides the resistor 45a from the output Out1. In order to operate the emitter follower Tr7a linearly, the collector bias thereof is necessary to be at least 0.7 to 0.8 V higher than the output Out1, but the current flowing therein may be small enough to operate the transistor Tr7a linearly.

In the foregoing detailed description, the method and apparatus of the present invention have been described with reference to specific exemplary embodiments thereof. However, it will be evident that various modifications and changes may be made thereto without departing from the broader spirit and scope of the present invention. The present specification and figures are accordingly to be regarded as illustrative rather than restrictive.

What is claimed is:

1. A traveling wave amplifier, comprising:
a plurality of amplifying units connected in parallel between an input port and an output port of the traveling wave amplifier, the amplifying units each having a cascade unit including:
a switching transistor configured to receive an input modulating signal from the input port;
a dynamic cascade transistor configured to output an amplified output signal to the output port, the dynamic cascade transistor feeding the amplified output thereof back to a base of the dynamic cascade transistor through a resistive divider; and
a static cascade transistor configured to be driven by a first static bias provided to a base thereof, the static cascade transistor being put between the switching transistor and the dynamic cascade transistor, wherein the switching transistor, the static cascade transistor, and the dynamic cascade transistor are connected in series.

2. The travelling wave amplifier of claim 1,
wherein the resistive divider includes two resistors connected in series between the collector of the dynamic cascade transistor and another input port to receive a second static bias,
wherein the two resistors and the second static bias determines a base bias of the dynamic cascade transistor in low frequencies.

3. The travelling wave amplifier of claim 2,
wherein the cascade unit further includes an emitter follower between the collector of the dynamic cascade transistor and the resistive divider,
wherein the amplified output signal output from the dynamic cascade transistor is fed back to the base of the dynamic cascade transistor through the emitter follower and the resistive divider.

4. The travelling wave amplifier of claim 3,
wherein the emitter follower is provided with a collector bias whose level is higher than a level of the output port.

5. The travelling wave amplifier of claim 1,
wherein the cascade unit further includes a capacitor connected between the base of the dynamic cascade transistor and a ground, and wherein the dynamic cascade transistor and the static cascade transistor each provides a base-collector junction capacitor, and
wherein the base-collector junction capacitor of the dynamic cascade transistor and a parallel circuit of the capacitor and the base-collector junction capacitor of the static cascade transistor constitute a capacitive divider to determine the base level of the dynamic cascade transistor in high frequencies.

6. The travelling wave amplifier of claim 5,
wherein the cascade unit further includes a resistor connected in series to the capacitor, and
wherein the base level of the dynamic cascade transistor is determined by the base-collector junction capacitor of the dynamic cascade transistor and a parallel circuit of the base-collector junction capacitor of the static cascade transistor and a series circuit including the capacitor and the resistor.

7. A driver for driving an optical modulator, comprising:
a pair of input ports configured to receive a pair of input modulation signals;
an output port configured to output an output signal;
a pair of input transmission lines, each of the input transmission lines including input delay elements connected in series, each of the input transmission lines being connected to respective input ports at an end thereof, and each of the input transmission lines terminating at another end;
a pair of output transmission lines, each of the output transmission lines including output delay elements connected in series, each of the output transmission lines terminating in an end thereof, one of the output transmission lines being connected to the output port at another end thereof;
a plurality of amplifying units, each of the amplifying units being disposed between the input ports and the output port through ones of the input delay elements and ones of the output delay elements,
wherein each of the amplifying units is connected to the output port in an open-collector output through its respective ones of the output delay elements, and provides a cascade unit including:
a switching transistor configured to be connected to respective ones of the input delay elements of one of the input transmission lines,
a dynamic cascade transistor configured to be connected with respective ones of the output delay elements of one of the output transmission lines, the dynamic cascade transistor being dynamically biased in a base thereof with the open-collector output, and
a static cascade transistor connected in series to the switching transistor and the dynamic cascade transistor, the static cascade transistor being provided in a base thereof with a static bias.

8. The driver of claim 7,
wherein the dynamic cascade transistor is biased in the base thereof by the open-collector output through a resistive divider in low frequencies.

9. The driver of claim 8,
wherein the resistive divider is connected between the open-collector output of the dynamic cascade transistor and a static bias, the dynamic cascade transistor being biased in the base thereof in low frequencies by the static bias superposed with a voltage between the open-collector output and the static bias divided by the resistive divider.

10. The driver of claim 8,
wherein the resistive divider includes an emitter follower, the dynamic cascade transistor being biased in the base thereof by the open-collector output through the emitter follower and the resistive divider.

11. The driver of claim 10,
wherein the emitter follower is biased in a collector thereof higher than the open-collector output.

12. The driver of claim 7,
wherein the dynamic cascade transistor is dynamically biased in the base thereof in high frequencies through a capacitive divider including a base-collector junction capacitor of the dynamic cascade transistor and a base-collector junction capacitor of the static cascade transistor.

13. The driver of claim 12,
wherein the capacitive divider further includes a capacitor connected between the base of the dynamic cascade transistor and a ground, the base of the dynamic cascade transistor being biased in the high frequencies by the base-collector junction capacitor and a parallel circuit of the capacitor and the base-collector junction capacitor of the static cascade transistor, and
wherein the parallel circuit is connected in series to the base-collector junction capacitor of the dynamic cascade transistor.

14. The driver of claim 13,
wherein the capacitive divider further includes a resistor connected in series to the capacitor, the parallel circuit including the base-collector junction capacitor of the static cascade transistor and a series circuit of the capacitor and the resistor, and
wherein the resistor reduces a Q-factor of a loop circuit including the base-collector junction capacitor of the static cascade transistor, the capacitor, and the resistor.

15. A differential amplifier with open-collector outputs, comprising:
cascade units each including: a switching transistor configured to receive an input modulation signal in a base thereof, a dynamic cascade transistor providing the open-collector output, and a static cascade transistor put between the switching transistor and the dynamic cascade transistor, the static cascade transistor being biased in a base thereof with a DC signal; and
a current source commonly connected to the switching transistors in the cascade units,
wherein the open-collector output in each cascade unit is fed back to the base of the dynamic cascade transistor of each said cascade unit through a resistive divider.

16. The differential amplifier of claim 15,
wherein, in each cascade unit, the dynamic cascade transistor is biased in the base thereof by the open-collector output through the resistive divider in low frequencies, and through a capacitive divider formed by a base-collector junction capacitor of the dynamic cascade transistor and a base-collector junction capacitor of the static cascade transistor in high frequencies.

17. The differential amplifier of claim 16,
wherein each of the cascade units further includes a capacitor connected between the base of the dynamic cascade transistor and a ground, the capacitive divider being formed by the base-collector junction capacitor of the dynamic cascade transistor and a parallel circuit of the base-collector junction of the static cascade transistor and the capacitor connected in the base of the dynamic cascade transistor.

18. The differential amplifier of claim 17,
wherein each of the cascade units further includes a resistor connected in series to the capacitor, the parallel circuit being comprised of the base-collector junction capacitor of the static cascade transistor and a series circuit of the capacitor and the resistor, and
wherein the series circuit is connected to the base-collector junction capacitor in parallel.

19. The differential amplifier of claim 15,
wherein each of the cascade units further includes an emitter follower put between the open-collector output and the resistive divider, and
wherein the dynamic cascade transistor is biased in the base thereof from the open-collector output through the emitter follower and the resistive divider.

20. The differential amplifier of claim 19,
wherein the emitter follower is biased in a collector thereof with a power supply higher than the open-collector output.

* * * * *